(12) United States Patent
Siu

(10) Patent No.: US 6,572,004 B2
(45) Date of Patent: Jun. 3, 2003

(54) HERMETICALLY SEALED COMPONENT ASSEMBLY PACKAGE

(76) Inventor: Paul Siu, 499 Kings Road, 15th Floor North Point, Hong Kong (CN)

( * ) Notice: Subject to any disclaimer, the term of this patent is extended or adjusted under 35 U.S.C. 154(b) by 5 days.

(21) Appl. No.: 09/950,869

(22) Filed: Sep. 12, 2001

(65) Prior Publication Data

US 2002/0036224 A1 Mar. 28, 2002

Related U.S. Application Data

(60) Provisional application No. 60/234,265, filed on Sep. 21, 2000.

(51) Int. Cl.[7] .......................... B23K 1/06; H01L 23/02; H05K 5/06
(52) U.S. Cl. .................... 228/110.1; 228/175; 257/698; 438/118; 174/52.3
(58) Field of Search ............................. 228/124.6, 1.1, 228/110.1, 175; 257/690, 698; 361/820; 438/118; 174/52.3; 156/60

(56) References Cited

U.S. PATENT DOCUMENTS

| | | | | |
|---|---|---|---|---|
| 4,725,692 A | * | 2/1988 | Ishii et al. .................. 174/52.4 |
| 4,868,712 A | * | 9/1989 | Woodman .................... 361/689 |
| 5,097,318 A | * | 3/1992 | Tanaka et al. ............... 257/690 |
| 5,200,640 A | * | 4/1993 | Scheftic et al. ............. 257/693 |
| 5,294,897 A | * | 3/1994 | Notani et al. ................. 333/33 |
| 5,539,151 A | * | 7/1996 | Hamzehdoost et al. .... 174/52.4 |
| 5,656,985 A | | 8/1997 | Luu et al. |
| 5,904,499 A | * | 5/1999 | Pace .......................... 438/108 |
| 5,959,842 A | | 9/1999 | Leonard et al. |
| 6,094,361 A | * | 7/2000 | Batten et al. ................ 361/816 |
| 6,305,987 B1 | * | 10/2001 | Crane et al. ................. 439/676 |
| 6,307,258 B1 | * | 10/2001 | Crane et al. ................. 257/680 |
| 6,354,485 B1 | * | 3/2002 | Distefano ................ 228/179.1 |
| 6,413,800 B1 | * | 7/2002 | Kyle .......................... 438/115 |
| 6,475,832 B2 | * | 11/2002 | Crane et al. ................ 438/116 |

OTHER PUBLICATIONS

US 2002/0036224A1 Siu (Mar. 28, 2002).*
US 2003/0003626A1 Crane, Jr. et al. (Jan. 2, 2003).*

* cited by examiner

Primary Examiner—Tom Dunn
Assistant Examiner—Kiley Stoner
(74) Attorney, Agent, or Firm—Whitham, Curtis & Christofferson, P.C.

(57) ABSTRACT

A hermetically sealed electrical package having wires entering at the base and being embedded vertically in its walls for connecting to the leads of a component assembly within the package. The wires protrude vertically from the walls, serving as pins for electrical connection of the leads inside the package. The component assembly is secured to an inner side of the package by an adhesive. A cover is affixed to the upper edges of the walls by an ultrasonic weld so as to create a hermetic seal.

14 Claims, 2 Drawing Sheets

HERMETICALLY SEALED COMPONENT ASSEMBLY PACKAGE

This patent application claims priority from U.S. provisional application 60/234,265 entitled "Hermetically sealed component package design" filed on Sep. 21, 2000.

BACKGROUND OF THE INVENTION

1. Field of the Invention

The present invention generally relates to electronic component packaging, and in particular to packaging which is hermetically sealed.

2. Background Description

It is common in the trade to use hermetic sealing to protect electrical components from deterioration and promote long term viability of the components. There are two commonly employed methods used by the industry to make a hermetically sealed electrical package of this type. For example, components may be encapsulated within a casing using a non-conductive potting material. However, the components inside the package must be covered with a buffer material. Furthermore, there is a long process time to encapsulate the package by transfer molding or by using a liquid encapsulant. Another method of hermetic sealing is to use a header and cover design, and to glue the cover to the header with an adhesive. However, this process needs skilled labor and it takes time to cure the adhesive.

Thus the existing processes are slow and expensive. What is needed is a package design and hermetic sealing method usable in a mass production environment which provides for stable electrical connections to components inside a hermetically sealed container, without use of encapsulation material or an adhesive which take time and skilled labor.

SUMMARY OF THE INVENTION

It is therefore an object of the present invention to provide an improved hermetically sealed electrical package for component assemblies.

Another object of the invention is to provide a package design which is efficient to use in mass production of hermetically sealed component assemblies.

It is a further object of the invention to provide a package which can be hermetically sealed with a reduced cost and processing time.

Yet another object of the invention is to avoid the use of encapsulation techniques which require a relatively long process time for transfer molding or for use of a liquid encapsulant.

A further object of the invention is to provide a hermetic sealing method that is efficient in a mass production environment, not requiring skilled labor for the application of adhesives at the seal.

The invention provides a hermetically sealed electrical package having wires entering at the base and being embedded vertically in its walls for connecting to the leads of a component assembly within the package. The wires protrude vertically from the walls, serving as pins for electrical connection to the leads inside the package. The component assembly is secured to an inner side of the package by an adhesive. A cover is affixed to the upper edges of the walls by means of an ultrasonic weld so as to create a hermetic seal.

In a preferred embodiment, the package is a rectangular container having a rectangular floor joined to four walls arranged vertically from the floor, with each wall having two vertical edges and top and bottom horizontal edges, with the bottom horizontal edges being joined to the floor and the vertical edges forming joints between adjacent walls at right angles, with two walls opposite one another being channel walls and the other two walls opposite one another being side walls. The wires for connecting to the component assembly inside the container entering at the floor from outside the container and rise vertically inside a channel wall and terminate in a pin protruding from the top horizontal edge of the channel wall. The electrical component assembly is mounted with adhesive on an inner face of said container, and each of its conducting leads are electrically connected to one of the pins protruding from a channel wall. A cover for the container is joined without application of an adhesive to the top horizontal edges of all of the walls to seal said component assembly hermetically within said container, the cover and walls being of suitable material for bonding using an ultrasonic weld.

In a preferred embodiment of the invention the floor, walls and embedded wires with pins are molded as a unit.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
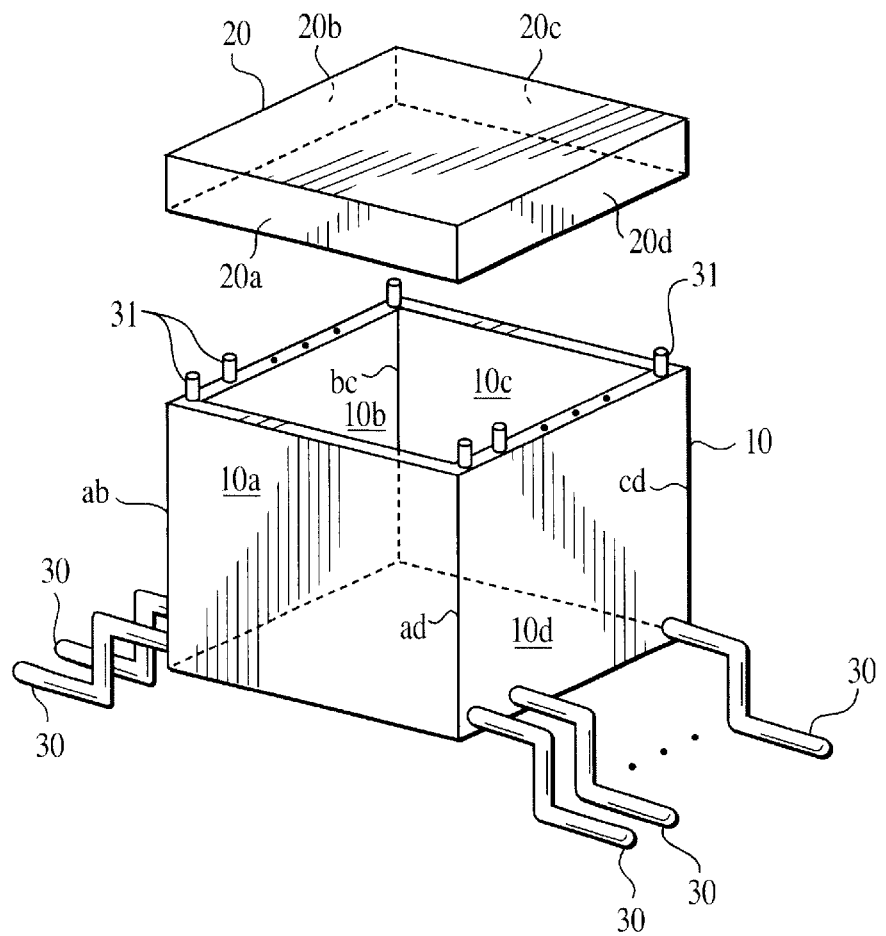
FIG. 1 is a perspective drawing of the invention's component assembly package design showing a header, a cover, and pins emerging from the header wall.

Referring now to the drawings, and more particularly to FIG. 1, there is shown a U-shaped package which is a rectangular box container 10 enclosed by four vertically positioned rectangular walls 10a, 10b, 10c and 10d each having four edges, two vertical edges and top and bottom horizontal edges. The walls are joined at their vertical edges to form joints ab, bc, cd, and ad. Walls 10a and 10c are opposite and parallel to one another, walls 10b and 10d are opposite and parallel to one another, and walls 10a and 10b are perpendicular to one another.

The package is for mounting on a circuit board, making electrical connection to the circuit board via wires 30 which enter the outward vertical faces of walls 10b and 10d and are then routed vertically up the inside of walls 10b and 10d, terminating in pins 31 which emerge vertically out of the top horizontal edges of walls 10b and 10d.

Figure 2A:
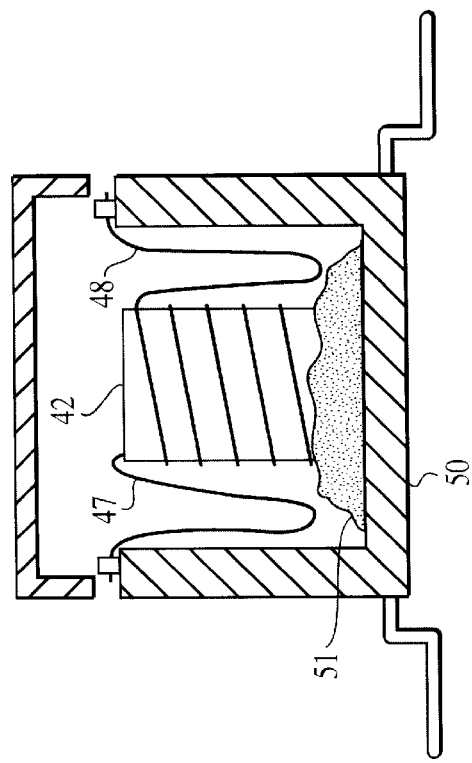
FIGS. 2A and 2B show side views of transformer coils mounted horizontally (FIG. 2A) and vertically (FIG. 2B) within the package.

The package has a cover 20 whose construction is best described with reference to FIG. 2, to which we will now turn. FIG. 2A shows en electrical device 41 (e.g. a transformer) mounted on the floor 50 of container 10 by means of adhesive 51 (e.g. glue). Conducting leads 45 and 46 from device 41 are electrically connected to pins 31 protruding from walls 10b and 10d, respectively, using standard techniques. Top 20 has lips 20a, 20b, 20c and 20d extending vertically downward in matching alignment with walls 10a, 10b, 10c, and 10d, respectively, to adjoin to the top horizontal edges of said walls.

Top 20 is affixed to container 10 by joining lips 20a, 20b, 20c, and 20d to the respective aligned top horizontal edges of walls 10*a*, 10*b*, 10*c* and 10*d* and performing an ultrasonic weld on the joint so as to create a hermetic seal of device 41 within container 10, without using adhesive. Note that in the preferred embodiment of the invention lips 20*b* and 20*d* are thinner than walls 10*b* and 10*d* so that when the lower horizontal edge of the lip abuts the top horizontal edge of the wall at joint 21 there is sufficient clearance of the joint from pins 31, including connection to conducting leads 45 and 46, so as not to interfere with the hermetic seal. Those skilled in the art will also note that an alternative construction would be to have the lips extend up from the walls rather than down from the cover, so that the ultrasonic weld without adhesive seals the joint between the top of the cover and the lips.

Figure 2B:
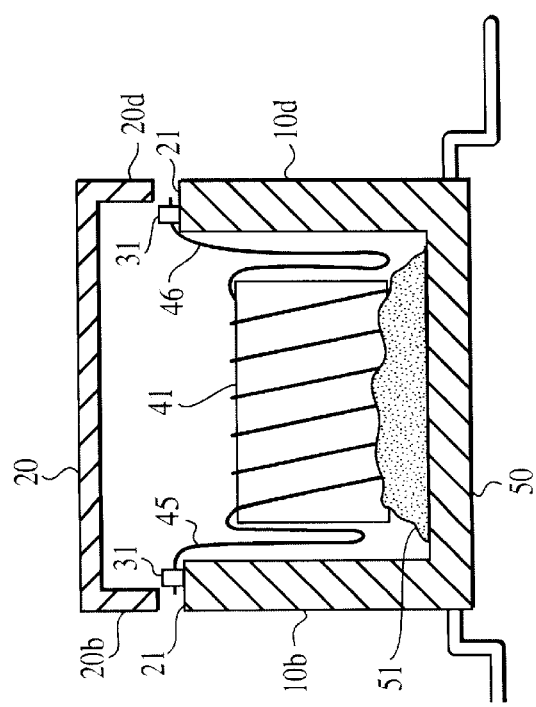

FIG. 2B is the same as FIG. 2A except that electrical device 42 is oriented vertically inside container 10. The orientation of the electrical device (or devices where there is an assembly of multiple devices) is not important. It is significant that the device be affixed to an inner face of the container with an adhesive, which serves to stabilize the device without encapsulation.

The ultrasonic weld is accomplished without any adhesive, the cover and walls being of material suitable for bonding with an ultrasonic weld in accordance with well known art. The welding time is about 0.5 seconds. This is very fast and avoids the cost of skilled labor and the time required either to cure adhesive or to encapsulate.

Those skilled in the art will observe that while FIG. 2A shows that electrical device 41 is affixed to floor 50 it could equally well be affixed via suitable adhesive materials to any inner face of container 10.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A package for mounting an electrical component assembly on a circuit board, comprising:
   a rectangular container having a rectangular floor joined to four walls extending vertically from the four respective edges of said floor, each said wall having two vertical edges and top and bottom horizontal edges, being joined to said floor edges near said bottom horizontal edges and said vertical edges forming joints between adjacent walls at right angles, two of said four walls opposite one another being channel walls and the remaining two of said four walls opposite one another being side walls;
   at least two wires, a first wire entering at the floor from outside said container and rising vertically inside a first one of said channel walls and terminating in a pin protruding from the top horizontal edge of said first wall, and a second wire entering from the opposite side of said container at the floor and rising vertically inside the second of said channel walls and terminating in a pin protruding from the top horizontal edge of said second wall;
   an electrical component assembly affixed with an adhesive to an inner face of said container, said assembly having at least two conducting leads, each said lead being electrically connected to one of said protruding pins; and
   a cover for said container, said cover being joined without adhesive to the top horizontal edges of all of said walls so as to form a hermetic seal of said component assembly within said container.

2. The package of claim 1, wherein said cover is joined to said horizontal edges via lips extending vertically downward from said cover.

3. The package of claim 2, wherein said lips do not touch said electrically connected pins, and wherein said electrically connected pins are within said hermetic seal.

4. The package of claim 3, wherein said lips extend vertically upward from said walls and wherein said cover is joined without adhesive to the top horizontal edges of said extending lips so as to seal said component assembly hermetically within said container.

5. The package of claim 1, wherein said component assembly is comprised of a plurality of devices being joined together by said adhesive.

6. The package of claim 1, wherein said container floor and walls are a single molded unit.

7. The package of claim 1, wherein said container and at least two wires form a single molded unit.

8. A method of manufacturing a hermetically sealed electrical component assembly for mounting on a circuit board, comprising the steps of:
   forming a rectangular container having a rectangular floor joined to four walls extending vertically from the four respective edges of said floor, each said wall having two vertical edges and top and bottom horizontal edges, being joined to said floor edges near said bottom horizontal edges and said vertical edges forming joints between adjacent walls at right angles, two of said four walls opposite one another being channel walls and the remaining two of said four walls opposite one another being side walls;
   mounting at least two wires within said channel walls, a first wire entering at the floor from outside said container and rising vertically inside a first one of said channel walls and terminating in a pin protruding from the top horizontal edge of said first wall, and a second wire entering from the opposite side of said container at the floor and rising vertically inside the second of said channel walls and terminating in a pin protruding from the top horizontal edge of said second wall;
   affixing an electrical component assembly to an inner face of said container with an adhesive, said assembly having at least two conducting leads, each said lead being electrically connected to one of said protruding pins; and
   ultrasonically welding a container cover to the top horizontal edges of said walls, thereby creating a hermetic seal of said component assembly within said container.

9. The method of claim 8, wherein said cover is joined to said horizontal edges via lips extending vertically downward from said cover.

10. The method of claim 9, wherein said lips are thinner than said walls so as to abut an outer portion of said top horizontal edges without touching said electrically connected pins, and wherein said electrically connected pins are within said hermetic seal.

11. The method of claim 10, wherein said lips extend vertically upward from said walls and wherein said ultrasonic welding joins said cover to the top horizontal edges of said extending lips.

12. The method of claim 8, wherein said component assembly is comprised of a plurality of devices being joined together by said adhesive.

13. The method of claim 8, wherein said container floor and walls are formed as a single molded unit.

14. The method of claim 8, wherein said container and said at least two wires are formed as a single molded unit.

* * * * *